US008228747B2

(12) United States Patent  
Onishi

(10) Patent No.: US 8,228,747 B2
(45) Date of Patent: Jul. 24, 2012

(54) DELAY ADJUSTMENT DEVICE, SEMICONDUCTOR DEVICE AND DELAY ADJUSTMENT METHOD

(75) Inventor: Satoshi Onishi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 338 days.

(21) Appl. No.: 12/588,909

(22) Filed: Nov. 2, 2009

(65) Prior Publication Data

US 2010/0124131 A1 May 20, 2010

(30) Foreign Application Priority Data

Nov. 19, 2008 (JP) ................................ 2008-295065

(51) Int. Cl.
*G11C 7/00* (2006.01)

(52) U.S. Cl. ...... 365/194; 365/191; 365/193; 365/233.1; 365/233.12; 365/233.13; 365/233.14; 713/400; 713/500; 713/600

(58) Field of Classification Search .................. 365/191, 365/193, 194, 233.1, 233.12, 233.13, 233.14; 702/106; 713/400, 500, 600
See application file for complete search history.

(56) References Cited

U.S. PATENT DOCUMENTS

| 6,456,544 B1 * | 9/2002 | Zumkehr ...................... 365/193 |
| 6,512,704 B1 * | 1/2003 | Wu et al. ................... 365/189.07 |
| 6,600,681 B1 * | 7/2003 | Korger et al. ................. 365/193 |
| 6,646,929 B1 * | 11/2003 | Moss et al. ..................... 365/194 |
| 7,038,953 B2 | 5/2006 | Aoki |
| 7,567,880 B2 * | 7/2009 | Iizuka ........................... 702/106 |
| 7,676,684 B2 * | 3/2010 | Ando ............................. 713/400 |
| 2010/0115324 A1 * | 5/2010 | Kuroki .......................... 713/401 |

FOREIGN PATENT DOCUMENTS

| JP | 2003-223786 | 8/2003 |
| JP | 2005-276396 | 10/2005 |
| JP | 2008-103013 | 5/2008 |
| JP | 2008-103013 A | 5/2008 |

OTHER PUBLICATIONS

European Search Report dated Feb. 25, 2010.

* cited by examiner

*Primary Examiner* — Pho M Luu
*Assistant Examiner* — Thao Bui
(74) *Attorney, Agent, or Firm* — McGinn IP Law Group, PLLC

(57) ABSTRACT

Provided is a delay adjustment device that contributes to downsizing the circuit that adjusts a flight time. The delay adjustment device is connected to a memory, and adjusts a timing to retrieve data with a data signal and a data strobe signal output from the memory. The delay adjustment device includes a data retrieve unit that receives the data signal and the data strobe signal, and outputs a data value of the data signal in accordance with the data strobe signal; and a control unit that issues a read command to the memory, calculates a flight time, and controls a valid period of the data strobe signal based on the flight time.

6 Claims, 8 Drawing Sheets

DELAY ADJUSTMENT DEVICE, SEMICONDUCTOR DEVICE AND DELAY ADJUSTMENT METHOD

BACKGROUND

1. Field of the Invention

The present invention relates to delay adjustment between a memory and a memory controller, and particularly to delay adjustment between a DDR SDRAM (Double Data Rate Synchronous Dynamic Random Access Memory) and a memory controller.

2. Description of Related Art

A DDR SDRAM is a memory including a high-speed transfer function. In particular, the DDR SDRAM can read and write data on both the rising and falling edges of the clock signal for synchronization between circuits. That is to say, the DDR SDRAM inputs and outputs data with twice the frequency of an external clock. Therefore, the DDR SDRAM has a narrower data width (width of determined data), at which data can be reliably read, than that of SDR SDRAM. It is also necessary to notify a timing to read data output from the DDR SDRAM correctly. Thus, the DDR SDRAM uses a data strobe signal (DQS). The data strobe signal is a signal to notify a timing to transfer data. Specifically, the DDR SDRAM outputs a data signal (DQ) and the data strobe signal at the same time. A requestor requesting data transfer receives the data signal and the data strobe signal in response to issuance of a read command. The requestor retrieves data from the data signal in accordance with the data strobe signal. For the purpose of this operation, a memory controller is employed. The memory controller is placed between the memory and the requestor, and includes general functions to control the operation of memory access.

When the requestor issues the read command to the memory, a difference in time (flight time) for data to reach the requestor occurs depending on the length of a line between the memory and the memory controller. This makes it difficult for the requestor to determine the timing to retrieve data. Particularly in the DDR SDRAM, a higher read-operation speed is attained, so the flight time between the memory and the memory controller with respect to an operation clock cycle cannot be ignored.

As a result, it is necessary to provide the memory controller having a configuration in which a delay of the flight time is considered to determine a timing to receive the data strobe signal. The flight time varies depending on implementation conditions, such as the length of a line between the memory and the memory controller. For this reason, the reception timing is not determined uniquely in the process of designing the memory controller. It is necessary to incorporate a function (for example, a circuit) for dealing with a certain range of flight time in the memory controller.

For example, Japanese Unexamined Patent Application Publication No. 2005-276396 discloses a technique of adjusting a delay time using an expected value at initialization of a device. In the technique, a calibration pattern is formed in a memory, and PASS/FAIL determination is performed using the formed pattern as the expected value at the initialization of the device. Then, the delay time is adjusted to be optimized based on the determination result. FIG. 6 is a circuit diagram showing a configuration of a memory interface control circuit disclosed in Japanese Unexamined Patent Application Publication No. 2005-276396.

The circuit disclosed in Japanese Unexamined Patent Application Publication No. 2005-276396 is a circuit which performs the functions as noted below. The circuit generates in the inside thereof a timing of retrieving the DQS, actually performs read and write operation on the DRAM, and checks an expectation value in order to confirm whether retrieved data is correct or not. The circuit selects an optimal timing after repetition of generating the timing of retrieving the DQS while gradually shifting the timing of retrieving the DQS.

Japanese Unexamined Patent Application Publication No. 2003-223786 discloses a circuit incorporating a comparator to detect a timing of starting point of preamble. The timing of starting point of preamble indicates a change from an impedance state to a low level state. FIG. 7 shows a data strobe receiver disclosed in Japanese Unexamined Patent Application Publication No. 2003-223786. Further, Japanese Unexamined Patent Application Publication No. 2008-103013 discloses a technique of eliminating unstable operation caused by a variation in delay of the data strobe signal. FIG. 8 is a diagram showing a configuration of a memory read controller disclosed in Japanese Unexamined Patent Application Publication No. 2008-103013. The memory read controller controls a pull up circuit 11s to pull-up the data strobe signal when a read request signal turns active. Upon receiving preamble, a signal changes from high level to low level. Input of the DQS is enabled valid by an enable signal of a control circuit 14s. Then, the input of DQS is disabled by the enable signal of the control circuit 14s after edges of the DQS signal are counted by the number of burst lengths.

The circuit disclosed in Japanese Unexamined Patent Application Publication No. 2005-276396 requires a circuit to preliminarily write a calibration pattern to a memory, and a comparison circuit to compare data read from a memory, resulting in an increase in circuit size.

The size of control circuit disclosed in Japanese Unexamined Patent Application Publication No. 2003-223786 becomes large, because the circuit needs to be added with a comparator for requesting independent 2nd Vref and a voltage supply. The control circuits disclosed in Japanese Unexamined Patent Application Publication Nos. 2003-223786 and 2008-103013 also detect the timing of retrieving the DQS signal, but do not recognize the flight time. In the configuration in which the flight time is not recognized, it is necessary to reset the clock in order to transfer data to the subsequent-stage circuit (requestor). In these cases, the control circuits use a FIFO, for example, which results in an increase in circuit size.

As described above, the flight time between the memory and the memory controller cannot be calculated in design phase because the flight time varies depending on the length of a line. Therefore, the memory controller requires a circuit to adjust the flight time.

SUMMARY

The present inventor has found a problem that the size of a circuit for adjusting the flight time is increased.

A first exemplary aspect of an embodiment of the present invention is a delay adjustment device that is connected a memory, and adjusts a timing to retrieve data with a data signal and a data strobe signal output from the memory, the delay adjustment device including: a data retrieve unit that receives the data signal and the data strobe signal, and outputs data value of the data signal in accordance with the data strobe signal; and a control unit that issues a read command to the memory, retrieves values of the data strobe signal in response to the read command to calculate a flight time, and controls a valid period of the data strobe signal based on the flight time. The control unit issues the read command, retrieves values of a plurality of data strobe signals in response to the read command, and then calculates the flight time using the values of the plurality of data strobe signals. The use of the flight time makes it possible to predict an arrival time of the data signal and the data strobe signal at the data retrieve unit, with accuracy. Therefore, a circuit that estimates the flight time using the data strobe signal is implemented. As a result, it is expected to downsize the circuit as compared to a circuit that estimates the flight time using the data signal.

A second exemplary aspect of an embodiment of the present invention is a semiconductor device including: the delay adjustment device as referred to above; and a processing unit that processes a data value output from the delay adjustment device. Using the delay adjustment device as referred to above, it is expected to downsize the whole circuit of the semiconductor device. It is also possible to retrieve the data value of the data signal in synchronization with the internal clock signal, when the internal clock signal used by the processing unit is used for the delay adjustment device.

A third exemplary aspect of an embodiment of the present invention is a delay adjustment method of a delay adjustment device that is connected to a memory and adjusts a timing to retrieve data with a data signal and a data strobe signal output from the memory, in response to a read command, the delay adjustment method including: issuing the read command to the memory; retrieving values of the data strobe signal at different timings in accordance with the read command; calculating a flight time using values of a plurality of data strobe signals retrieved; and controlling a valid period of the data strobe signal based on the flight time.

According to exemplary embodiments of the present invention, it is possible to downsize a circuit for adjusting to the flight time. This makes it possible to reduce the chip size, thereby enabling a reduction in cost.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
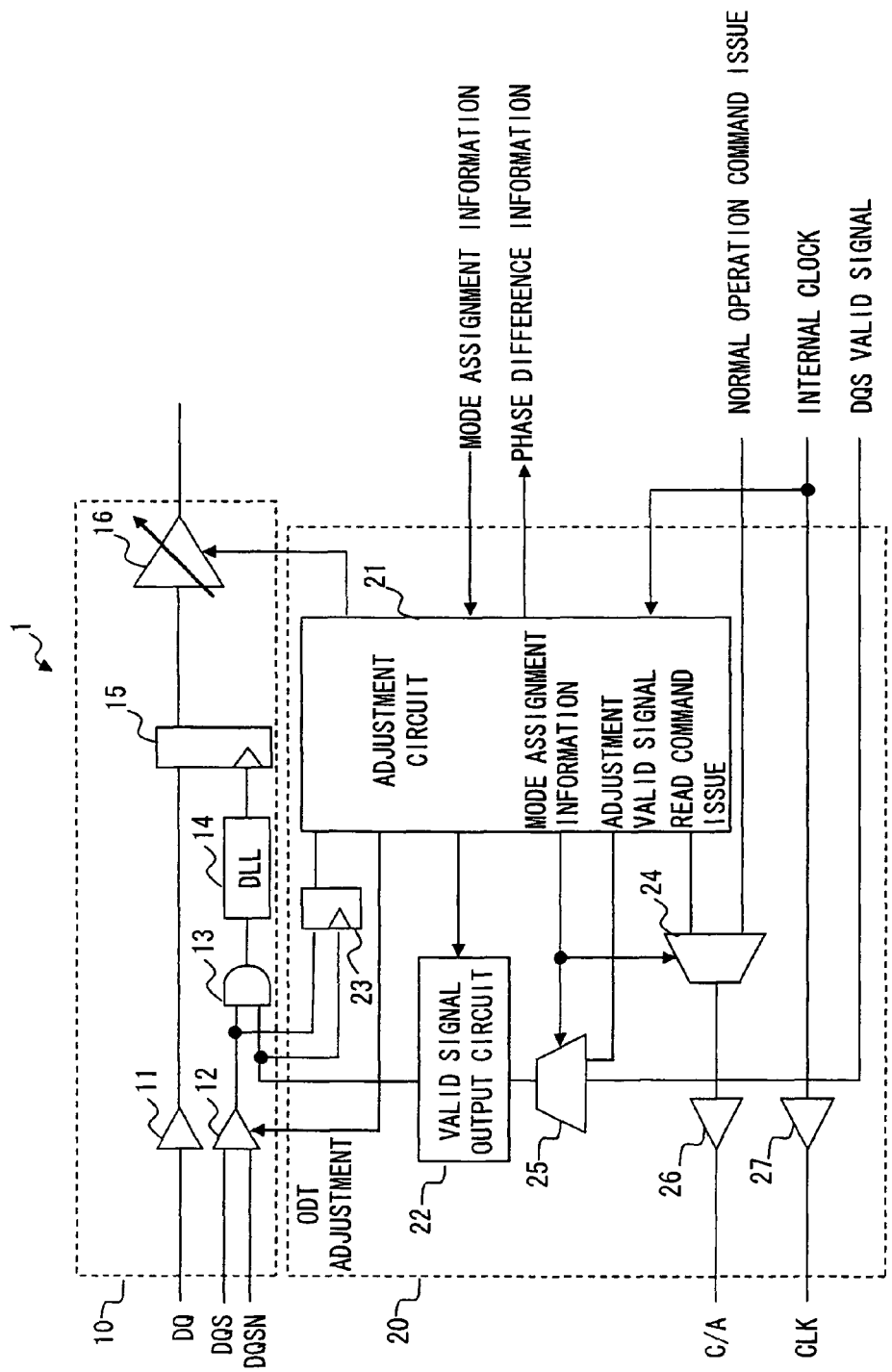
FIG. 1 is a block diagram showing an example of a configuration of a delay adjustment device according to a first exemplary embodiment of the present invention.

Exemplary embodiments of the present invention will be described hereinafter with reference to the drawings. The following description and the attached drawings are appropriately shortened and simplified to clarify the explanation. In the drawings, elements having the same configuration or function and corresponding parts are denoted by the same reference symbols, and description thereof is omitted.

In the following exemplary embodiments, a DDR SDRAM is used as an exemplary memory. A delay adjustment device calculates flight time using a data strobe signal output from the DDR SDRAM, and adjusts a timing to retrieve a data value from data signals properly. The following exemplary embodiments will be described by using a delay adjustment circuit as an example of the delay adjustment device. A device (circuit) which issues a memory access request (for example, a read command) is also referred to as a requestor, a processing circuit, or an internal circuit. It is assumed that the requestor accesses the memory through a memory controller. The memory controller is a device (circuit) which has a function to control memory access, for example. The delay adjustment device according to this exemplary embodiment may implement part of the function of the memory controller.

The DDR SDRAM outputs a data signal and a data strobe signal in response to the read command. The data signal (hereinafter also referred to as "DQ") is a signal which transfers data in response to the read command. The data strobe signal (hereinafter also referred to as "DQS") is a signal which notifies a timing to transfer data, and is output from the memory together with the data signal.

[First Exemplary Embodiment]

FIG. 1 is a block diagram showing an example of a configuration of a delay adjustment device (delay adjustment circuit) according to the first exemplary embodiment of the present invention. A delay adjustment circuit 1 includes a data retrieve unit 10 and a control unit 20.

The data retrieve unit 10 receives the data signal acid data strobe signal from the DDR SDRAM, and outputs the data value of the data signal in accordance with the data strobe signal. The control unit 20 controls the timing for the data retrieve unit 10 to output the data value. Specifically, the data retrieve unit 10 is controlled such that the control unit 20 adjusts a valid period of the data strobe signal.

Figure 2:
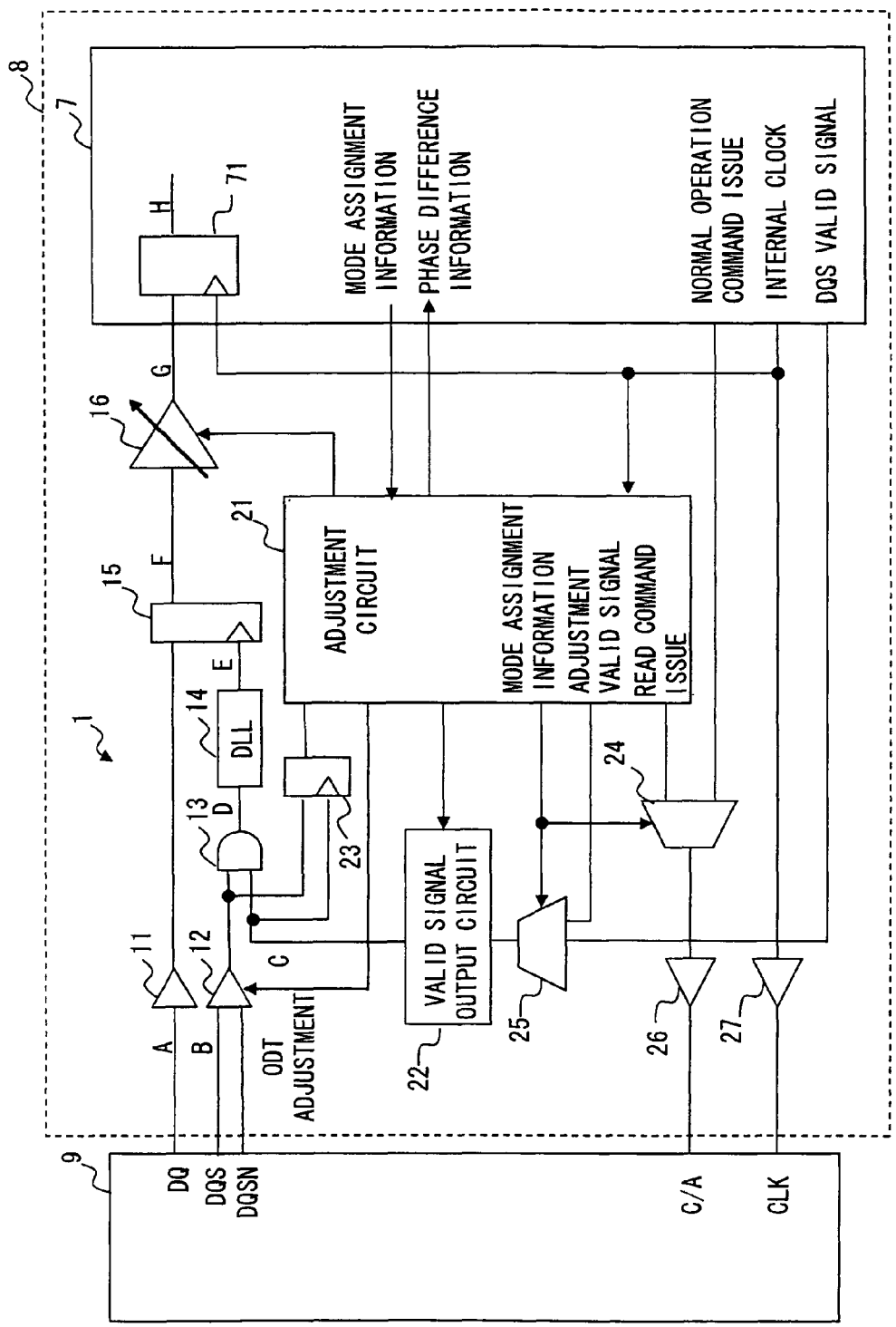
FIG. 2 is a block diagram showing an example of a configuration of a DDR SDRAM and a semiconductor device incorporating the delay adjustment circuit shown in FIG. 1.

The control unit 20 calculates the flight time using the data strobe signal. Specifically, the control unit 20 issues the read command to the DDR SDRAM, and retrieves the value of the data strobe signal (hereinafter also referred to as "strobe value"). The control unit 20 then calculates the flight time using the value of the data strobe signal thus obtained. The control unit 20 also controls the valid period of the data strobe signal based on the calculated flight time. Namely, the control unit 20 notifies the data retrieve unit 10 of the valid period of the data strobe signal to thereby control the timing for the data retrieve unit 10 to output the data value in accordance with the data strobe signal. Details of the data retrieve unit 10 and the control unit 20 will be described later. FIG. 2 is a block diagram showing an example of a configuration of a DDR SDRAM 9 and a semiconductor device 8 incorporating the delay adjustment circuit 1 shown in FIG. 1. The semiconductor device 8 includes the delay adjustment circuit 1 and a processing circuit 7. Symbols A to H indicate signals in FIG. 2 and are used later in the description of FIG. 5. Elements of a memory controller which have no relationship to the present invention are omitted in FIG. 2.

The processing circuit 7 issues a command, reads desired data from the DDR SDRAM 9, and uses the read data. The processing circuit 7 is also referred to as a requestor because the processing circuit 7 requests the DDR SDRAM 9 to send data, by issuing the read command. The processing unit 7 includes a flip-flop 71. The flip-flop 71 retrieves data value from the delay adjustment circuit 1 in accordance with an internal clock signal used by the processing circuit 7, and outputs the data value. The output data value is used in the processing of the processing circuit 7. Exemplary figures and details of the processing are omitted as the processing depends on the function of the processing circuit 7.

The processing circuit 7 outputs mode assignment information to the delay adjustment circuit 1. The mode assignment information assigns either an adjustment mode or a normal mode. The adjustment mode is a mode for calculating the flight time. The normal mode is a mode for executing a command issued by the processing circuit 7. The processing circuit 7 also outputs the internal clock signal and a DQS valid signal (DQS mask signal). The DQS valid signal is a signal which delays a timing by a delay period which is measurable in the design, in response to issuing the read command, to thereby enable the data strobe signal.

The delay adjustment circuit 1 outputs data read from the DDR DRAM 9 into the processing circuit 7. The delay adjustment circuit 1 also calculates the flight time and adjusts a timing to retrieve the data value. The delay adjustment circuit 1 operates in the adjustment mode and the normal mode. In the adjustment mode, the delay adjustment circuit 1 calculates the flight time. In the normal mode, the delay adjustment circuit 1 controls at least one of the timing to retrieve the data value from the data signal and the timing to output the retrieved data value to the processing circuit 7.

In addition, FIG. 2 shows an example of a configuration of a memory of the DDR SDRAM and a semiconductor device incorporating the delay adjustment circuit 1 shown in FIG. 1 in order to explain these relationship. The processing circuit 7 incorporated in the semiconductor device 8 is an example, and therefore is not limited thereto configure of FIG. 2, and may have different connection or other components.

Next, details of the data retrieve unit 10 and the control unit 20 which are included in the delay adjustment circuit 1 will be described with reference to the FIGS. 1 and 2.

The data retrieve unit 10 includes a buffer (first buffer) 11, a buffer (second buffer) 12, a mask circuit (mask unit) 13, a delay circuit (DDL, strobe signal delay unit) 14, a flip-flop (data value retrieve unit) 15, and a variable delay circuit (delay unit) 16. The control unit 20 includes an adjustment circuit (adjustment unit, calibration circuit) 21, a valid signal output circuit (valid signal output unit, delay adjustment circuit) 22, a strobe value retrieve circuit (strobe value retrieve unit) 23, switches 24 and 25, a buffer (third buffer) 26, and a buffer (fourth buffer) 27.

The buffer 11 is an input buffer that receives a data signal. The buffer 12 is an input buffer that receives a data strobe signal.

The mask circuit 13 outputs the data strobe signal during a valid period of the data strobe signal and masks the data strobe signal during an invalid period of the data strobe signal. Specifically, the mask circuit 13 receives the data strobe signal from the buffer 12 and the valid signal from the valid signal output circuit 22, and then outputs a logical AND of the data strobe signal and valid signal. The valid signal is a signal which indicates the valid period of the data strobe signal. High level of the valid signal indicates the valid period, for example. The mask circuit 13 enables (make active) the data strobe signal in accordance with the valid signal. The control circuit 20 generates the valid signal. That is to say, the mask circuit 13 enables the data strobe signal in response to instructions from the control circuit 20.

The delay circuit 14 shifts the phase of the data strobe signal by a half cycle of a clock, for example. The data signal and the data strobe signal are output with the same phase. Accordingly, the timing to retrieve the data value from the data signal in accordance with the data strobe signal is not reliable (i.e., there is no window). For this reason, the delay circuit 14 performs a control to shift the data strobe signal.

The flip-flop 15 retrieves the data value from the data signal in accordance with the data strobe signal output from the delay circuit 14.

The variable delay circuit 16 delays the output of the data value in response to instructions from the control circuit 20. As a result, the data value can be retrieved reliably according to the internal clock signal used by the processing circuit 7.

The adjustment circuit 21 calculates the flight time, and then controls the valid period of the data strobe signal. Specifically, the adjustment circuit 21 calculates the flight time in the adjustment mode, and controls the valid period of the data strobe signal with the calculated flight time in the normal mode. The adjustment circuit 21 receives the mode assignment information from the processing circuit 7, and then performs switching between the adjustment mode and the normal mode based on the assignment information by use of the switches 25 and 26.

In the adjustment mode, the adjustment circuit 21 outputs an adjustment valid signal in place of the DQS valid signal output from the processing circuit 7. The adjustment valid signal is a signal indicating a timing when the valid signal output circuit 22 outputs a valid signal. Here, the valid signal is a signal indicating the timing when the strobe value retrieve circuit 23 retrieves the value of the data strobe signal, for example. The adjustment circuit 21 also issues the read command to the DDR SDRAM 9.

When calculating the flight time, the adjustment circuit 21 issues the read command, and instructs the valid signal output circuit 22 of the timing to output the valid signal. At this point, the adjustment circuit 21 instructs to output the valid signal at different timings. Specifically, the adjustment circuit 21 outputs an amount of delay (delay time) to the valid signal output circuit 22. Then, the adjustment circuit 21 issues a plurality of read commands, and changes the delay amount so that the valid signals are output at different timings. Thus, the values of data strobe signals are retrieved, and the flight time is calculated using the retrieved values. In addition, the valid signals may be output at different timings in response to the issuance of one read command, and then a plurality of values of data strobe signals may be retrieved.

In the normal mode, when the valid period of the data strobe signal is controlled using the flight time, the adjustment circuit 21 outputs the amount of delay calculated based on the flight time, to the valid signal output circuit 22. As a result, the valid signal output circuit 22 delays a timing to enable the valid signal by the delay time which is measurable in the design and designated by the processing circuit 7, and the flight time. Therefore, the data strobe signal is enabled at the time when the data signal actually reaches to the data retrieve unit 10, and thus the data can be reliably retrieved.

The valid signal output circuit 22 receives one of the DQS valid signal and the adjustment valid signal as the valid signal through the switch 25. The valid signal output circuit 22 outputs the valid signal after the elapse of time (amount of delay) which is notified by the adjustment circuit 21. The valid signal is output to the mask circuit 13 and the strobe value retrieve circuit 23.

The strobe value retrieve circuit 23 retrieves the value of the data strobe signal in accordance with the valid signal. That is to say, the strobe value retrieve circuit 23 retrieves the value of the data strobe signal to the flip-flop at the timing when the valid signal is enabled. The retrieved value of the data strobe signal is output to the adjustment circuit 21.

The switch 24 is a switch to select either a command issued by the processing circuit 7 or the read command issued by the adjustment circuit 21, in accordance with the mode assignment information. The switch 25 is a switch to select either the valid signal output from the processing circuit 7 or the valid signal output from the adjustment circuit 21, in accordance with the mode assignment information. It is assumed herein that the switches 24 and 25 select signals output from the processing circuit 7 in the normal mode, and select signals output from the adjustment circuit 21 in the adjustment mode.

The buffer 26 is an output buffer to output the command selected by the switch 24 to the DDR SDRAM 9. The buffer 27 is an output buffer to output the internal clock signal to the DDR SDRAM 9.

The flight time is a delay time caused by lines from the memory controller to the DDR SDRAM 9 and from the DDR SDRAM 9 to the memory controller. In FIG. 2, the flight time is a transfer time of the signal between the semiconductor device 8 and the DDR SDRAM 9. That is, a delay time caused in the semiconductor device 8 is calculable because the delay caused in the semiconductor device 8 is defined at the design stage (that is, a delay time which is measurable in the design). However, the delay time between the semiconductor device 8 and the DDR SDRAM 9 varies depending on a line length therebetween. The line length varies with a device incorporating the semiconductor device 8, so the delay time cannot be calculated at the design stage. Accordingly, the delay adjustment circuit 1 needs to calculate the delay time.

The delay adjustment circuit 1 uses a clock signal synchronized with the internal clock signal used by the processing circuit 7. Therefore, the adjustment circuit 21 operates based on the internal clock signal. FIGS. 1 and 2 illustrate that the internal clock signal is supplied from the processing circuit 7 to the adjustment circuit 21 and the DDR SDRAM 9.

According to the configuration of the delay adjustment circuit 1 shown in FIG. 1, the control unit 20 implements functions as described below. The control unit 20 outputs the adjustment valid signal as the valid signal from the valid signal output circuit 22. The adjustment valid signal is obtained by adding a given delay to the internal clock signal. The control circuit 20 also includes a flip-flop (strobe value retrieve circuit 23) which retrieves the data strobe signal at a timing when the valid signal output circuit 22 outputs the valid signal. Then, the control unit 20 outputs a signal to control the variable delay circuit 16 located between the flip-flop 15 and the flip-flop 71. The flip-flop 15 retrieves the data value of the data signal in accordance with the data strobe signal. The flip-flop 71 operates based on the internal clock signal.

Next, operation of the delay adjustment circuit 1 will be described. In the adjustment mode, that is, at the time of executing calibration, the adjustment circuit 21 issues the read command to the DDR SDRAM 9. In response to the read command, the DQ and the DQS are transferred from the DDR SDRAM 9 after the elapse of a calculated time. The calculated time is a sum of a number of clocks, which is preliminarily set and is measurable in the design, and the flight time of a mounting board. At that time, a phase relation between the DQS and the internal clock signal is not clear, but the data strobe signal returns a steady waveform.

Figure 3:
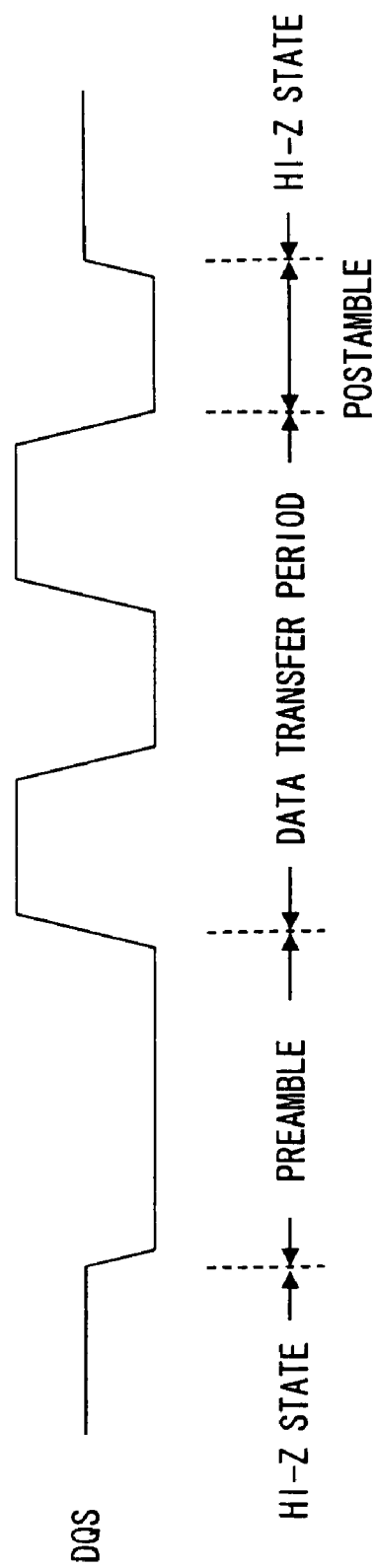
FIG. 3 is a diagram showing an exemplary waveform of a data strobe signal.

Here, the waveform of the data strobe signal will be described with reference to FIG. 3. The data strobe signal forms a waveform in Hi-z state (read preamble), preamble, a period of valid data, postamble, and Hi-z state. The data strobe signal keeps high impedance state (Hi-z state) before receiving the read command. Upon receiving the read command, the strobe signal turns from the high impedance state to the low level. The preamble is a first low-level period. The preamble occurs about one clock before the first data is output. A valid data period is a period for transferring data, and toggling is performed while the valid data exists. The postamble is a period subsequent to the last data edge, and then the status changes to the high impedance state again.

The data strobe signal reaches the input buffer 12 after the elapse of the delay time which is measurable in the design and the flight time after the issuance of the read command. Read latency is a time which is measurable (calculable) in the design. The processing circuit 7 and the adjustment circuit 21 preliminarily store the read latency period. Hereinafter, the delay time which is measurable in the design and occurs upon issuance of the read command is also referred to as "read latency". As described above, the flight time varies depending on the line length and the like. Therefore the adjustment circuit 21 calculates the flight time. In this exemplary embodiment, the adjustment circuit 21 calculates the flight time by detecting the preamble period of the data strobe signal, for example. Regarding the data strobe signal, a change in the strobe value in the preamble period is twice as large as that in a data transfer period. For this reason, the beginning of the transfer period can be reliably recognized by detecting the change in the strobe value of the preamble. It is desirable to calculate the flight time using the preamble.

An exemplary operation will be described. The processing circuit 7 assigns the mode assignment information to the adjustment mode at the timing of adjusting the flight time, and then outputs the mode assignment information to the adjustment circuit 21. The adjustment circuit 21 switches the switches 24 and 25 to the adjustment mode in accordance with the mode assignment information. The adjustment circuit 21 inputs the read command to the switch 24, and inputs the adjustment valid signal to the switch 25. The adjustment circuit 21 also specifies the amount of delay to be notified to the valid signal output circuit 20. The strobe value retrieve circuit 23 retrieves the value of the data strobe signal (strobe value) in accordance with the valid signal output from the valid signal output circuit 22. In that time, the adjustment circuit 21 controls the timing for the valid signal output circuit 22 to output the value signal. Specifically, the valid signal output circuit 22 delays the adjustment valid signal depending on the amount of delay notified from the adjustment circuit 21, and outputs the delayed adjustment valid signal as the valid signal. The adjustment circuit 21 repeats processing to issue the read command and obtain the value of the data strobe signal while changing the amount of delay in the adjustment mode. The adjustment circuit 21 calculates an amount of delay to predict the occurrence of the preamble and then obtains the plurality of strobe values in order to detect the timing when the preamble is actually loaded into the buffer 11.

Figure 4:
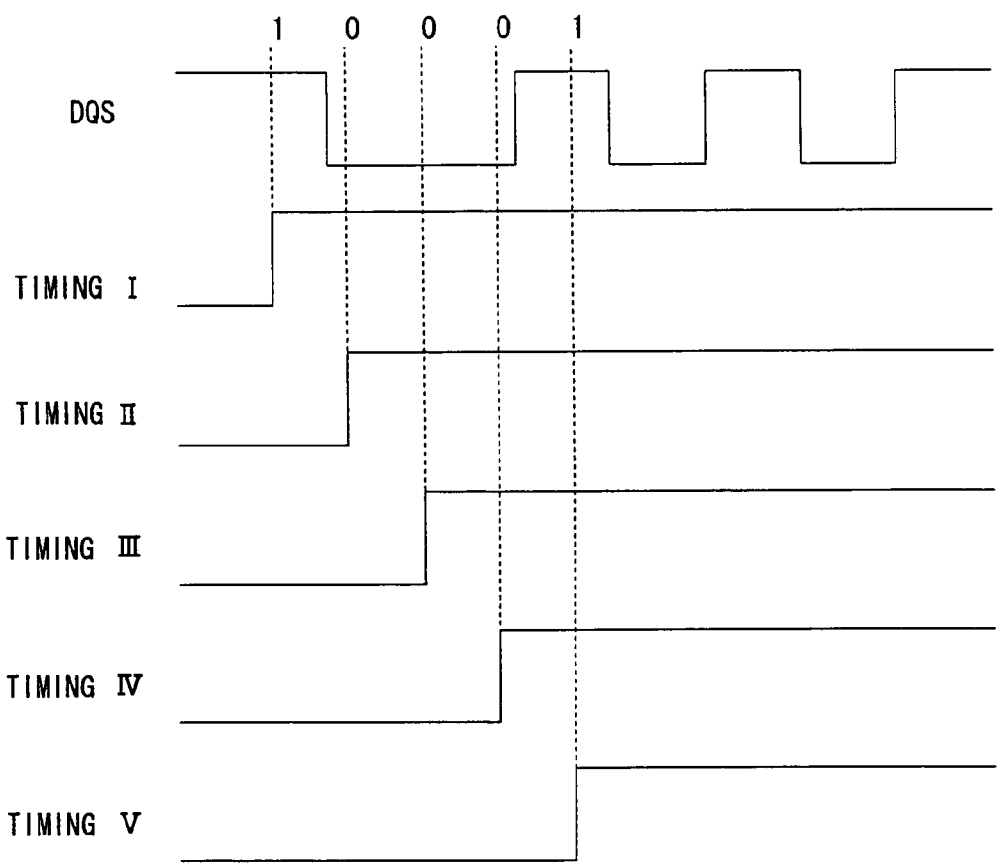
FIG. 4 is a schematic diagram for explaining an exemplary relationship between values of a strobe data signal retrieved by a strobe value retrieve circuit and amounts of delay.

The relationship between values of the data strobe signal retrieved by the strobe value retrieve circuit 23 and the amounts of delay will be described with reference to FIG. 4. FIG. 4 shows an example in which preamble period is detected by using five amounts of delay, at timings I to IV. The value of the data strobe signal is at high level (1) at the timings I and V, and is at low level (0) at the timings II, III, and IV. Thus, the adjustment circuit 21 detects that the period between the timing III and the timing IV corresponds to the preamble period.

As shown in FIGS. 1 and 2, the internal clock signal of the processing circuit 7 is output to the DDR SDRAM 9. Though the read command is output from either the processing circuit 7 or the adjustment circuit 21, the both circuits operate according to the internal clock signal. The DDR SDRAM 9 generates the data strobe signal and the data signal according to the internal clock signal, and then outputs these signals. Hence, the value of the data strobe signal changes at a timing corresponding to the internal clock signal. Consequently, the adjustment circuit 21 can detect the phase relationship between the data strobe signal and the internal clock signal by detecting the position of the data strobe signal. That is to say, the adjustment circuit 21 can calculate a phase difference between the data strobe signal and the internal clock signal. The adjustment circuit 21 stores information indicating a period less than one clock as the phase difference. In the case where the phase difference is equal to or more than one clock, the adjustment circuit 21 outputs information indicating the number of clocks corresponding to the phase difference, as the phase difference information, to the processing circuit 7.

As described above, in the control unit 20, the strobe value retrieve circuit 23 retrieves the strobe value of the data strobe signal with the valid signal which passes through the valid signal output circuit 22. The adjustment circuit 21 repeats issuing the read command and retrieving the strobe value while changing the amount of delay. Thus, the adjustment circuit 21 can determine the phase relationship between the data strobe signal and the internal clock signal when the data strobe signal is retrieved. As a result, the adjustment circuit 21 obtains the flight time based on the phase relationship.

In this manner, the adjustment circuit 21 obtains the phase difference between the internal clock signal and data strobe signal. The adjustment circuit 21 notifies the valid signal circuit 22 of the flight time as the amount of delay in order to delay the output of the valid signal in the normal mode. The valid signal output circuit 22 delays the timing to output the DQS valid signal output from the processing circuit 7 with the use of the notified amount of delay. The valid signal output circuit 22 then outputs the DQS valid signal delayed by the read latency and the flight time as the valid signal to the mask circuit 13.

The phase difference arises at the time when the data value retrieved at the timing of the data strobe signal is transferred to the internal clock. The phase difference can also be calculated by obtaining the phase relationship between the data strobe signal and internal clock signal. To retrieve the data value held by the flip-flop 15 according to the internal clock signal, it is necessary to take an occurrence of racing into consideration. The adjustment circuit 21 delays outputting the data value output from the flip-flop 15 based on the phase relationship between the data strobe signal and the internal clock signal. Specifically, the adjustment circuit 21 notifies the variable delay circuit 16 of the amount of delay for the data value calculated based on the phase relationship. The variable delay circuit 16 delays outputting the data value output from the flip-flop 15 by the notified amount of delay for the data value, and outputs it to the flip-flop 71. Therefore, the flip-flop 71 can reliably retrieve the data value according to the internal clock signal. Thus, the adjustment circuit 21 and the variable delay circuit 16 perform control so that the proper amount of delay is added to the data value in order to prevent the occurrence of racing. Then, the data value can be reliably transferred to the internal clock.

Figure 5:
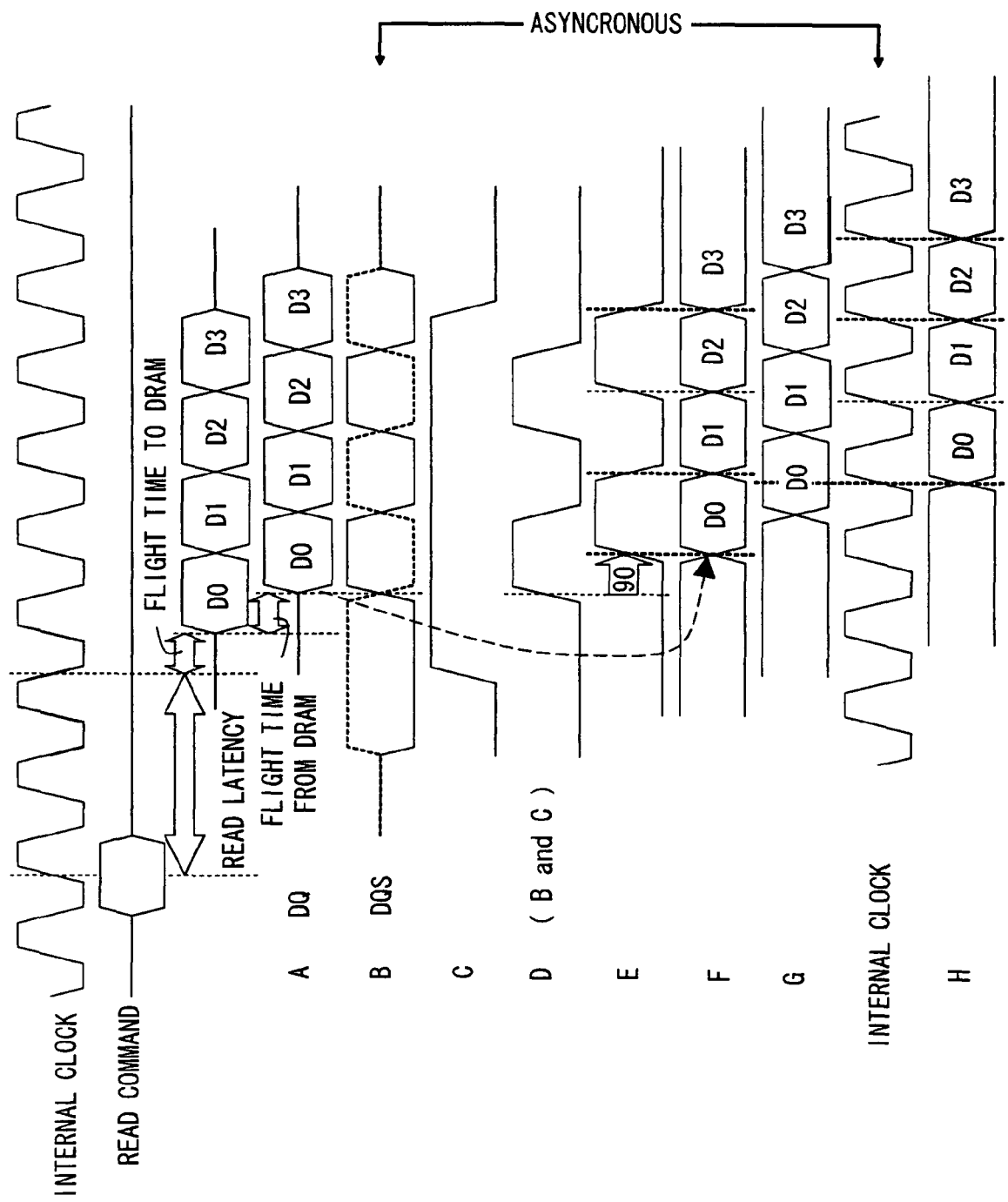
FIG. 5 is a timing chart showing signal values obtained after a read command is issued in a normal mode.
Figure 6:
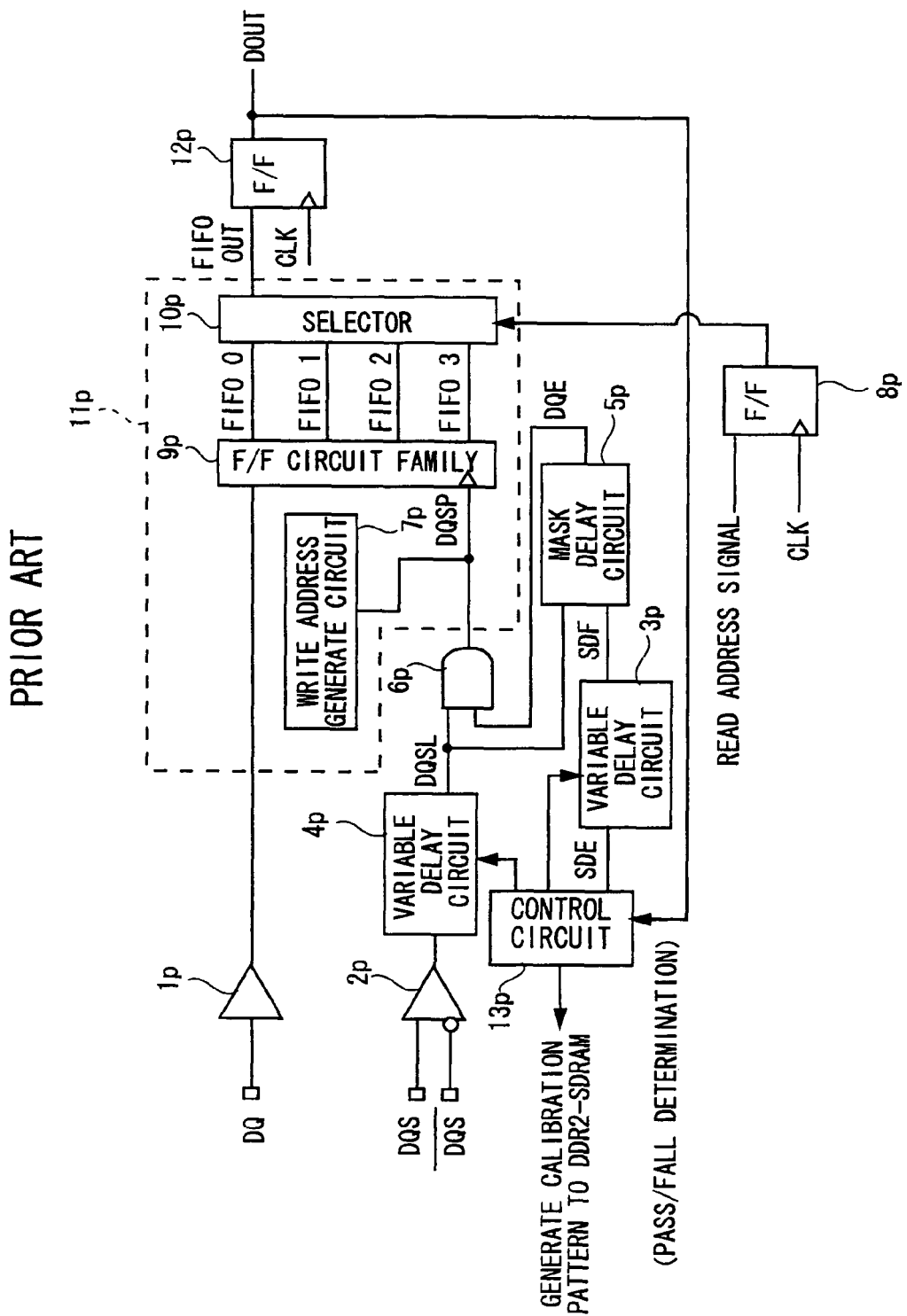
FIG. 6 is a circuit diagram showing a configuration of a memory interface control circuit disclosed in Japanese Unexamined Patent Application Publication No. 2005-276396.
Figure 7:
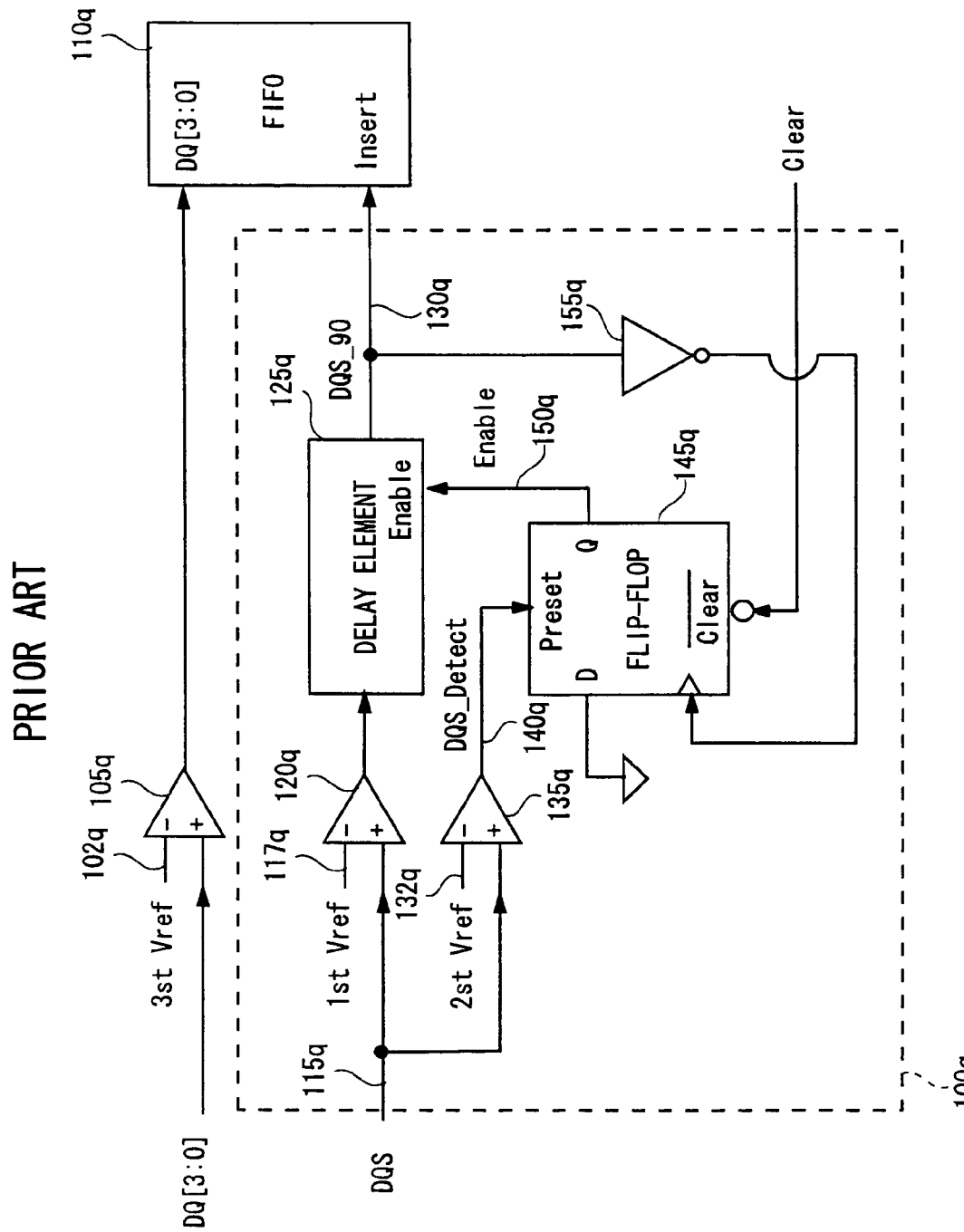
FIG. 7 is a circuit diagram showing a data strobe receiver disclosed in Japanese Unexamined Patent Application Publication No. 2003-223786.
Figure 8:
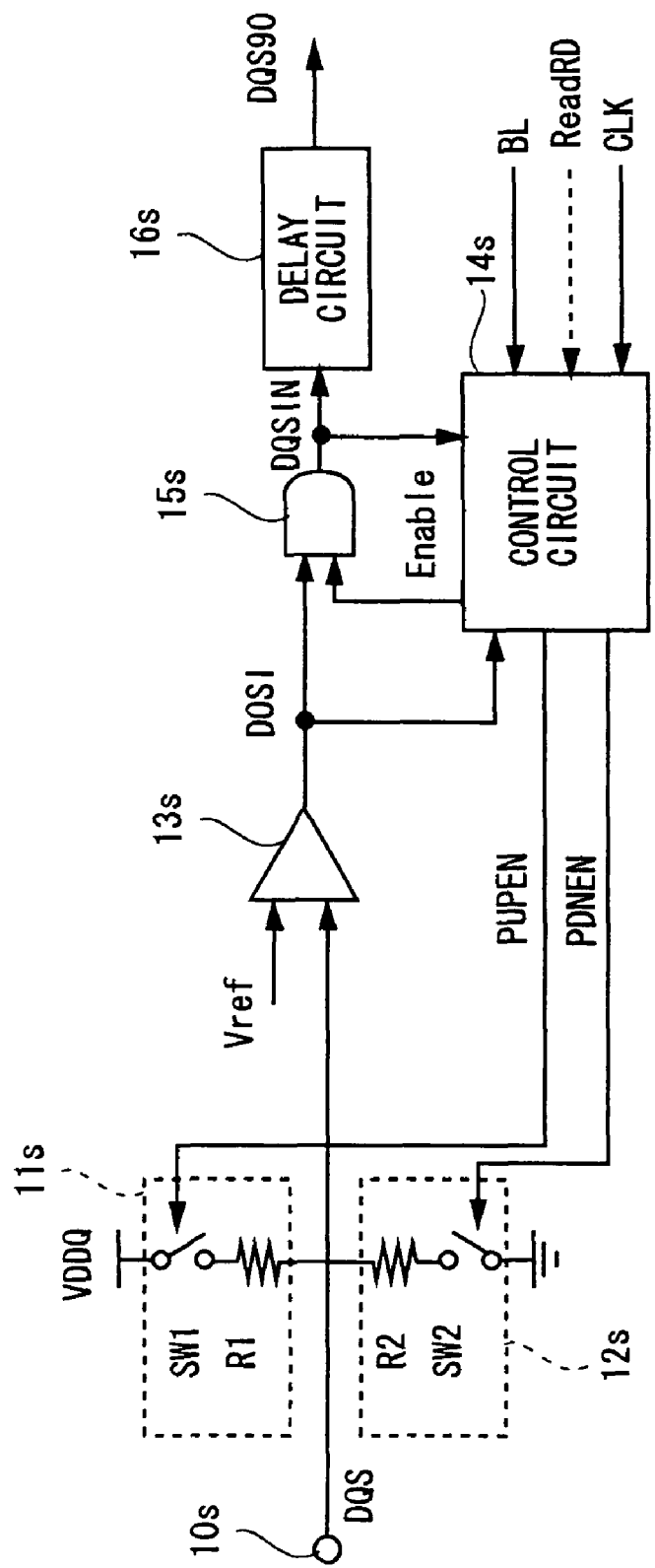
FIG. 8 is a diagram showing a configuration of a memory read controller disclosed in Japanese Unexamined Patent Application Publication No. 2008-103013.

FIG. 5 is a timing chart showing signal values obtained after the read command is issued in the normal mode. Symbols "A" to "H" in FIG. 5 correspond to symbols "A" to "H" indicating the signals in FIG. 2. The DDR SDRAM is also referred to as DRAM. Hereinafter, signals denoted by A to H are referred to as signals A to H, respectively. The internal clock signal is shown in the first line and in the second line from the bottom in FIG. 5. The data signal output from DDR SDRAM 9 is shown in the second line. The data signal is a signal delayed by the read latency and the flight time to the DDR SDRAM 9. The flight time is a sum of a flight time from the issuance of the command by the buffer 26 to the DDR SDRAM 9 and a flight time from the DDR SDRAM 9 to the buffer 11.

The buffer 11 receives a data signal (signal A) which is delayed by the read latency and the flight time. The buffer 12 also receives a data strobe signal (signal B) which is delayed by the read latency and the flight time. The valid signal output circuit 22 outputs a valid signal (signal C) which is obtained by delaying the valid signal output from the processing circuit 7 by the read latency and the flight time.

The mask circuit 13 outputs a logical AND signal (signal D) of the data strobe signal (signal B) and the valid signal (signal C). The delay circuit 14 outputs a signal E whose phase is shifted by 90 degrees with respect to the phase of the signal D. The flip-flop 15 outputs a signal F which is obtained by retrieving the signal A in accordance with the signal E. In this case, the signal E is a signal which is obtained by activating the data strobe signal (signal B) by the valid signal (signal C) delayed by the flight time. This enables the flip-flop 15 to retrieve the data value in consideration of the delay corresponding to the flight time.

The variable delay circuit 16 delays the signal F by a time corresponding to the amount of delay notified by the adjustment circuit 21, and outputs the delayed signal F as a signal G. The variable delay circuit 16 adjusts the timing of outputting the signal G so that the flip-flop 71 can easily retrieve the data value according to the internal clock signal. The flip-flop 71 retrieves the data value from the signal G according to the internal clock signal and outputs a signal H.

As shown in FIG. 5, the data strobe signal (signal B) is asynchronous with the internal clock signal. Therefore, the signal F which retrieves the data value from the data signal in accordance with the data strobe signal is also asynchronous with the internal clock signal. For this reason, the variable delay circuit 16 delays the signal F to shift the phase so that the flip-flop 71 can easily capture the data value according to the internal clock signal. That is, the delay adjustment circuit 1 adjusts the phase difference that is a shift in the phase relationship between the data strobe signal and the internal clock signal. The adjustment is possible because the delay adjustment circuit 1 (adjustment circuit 21) recognizes the phase difference. In this way, the delay adjustment circuit 1 adjusts the output of the signal F to avoid racing. These adjustment functions eliminate the need for a FIFO, thereby making it possible to transfer data from the adjustment circuit 1 to the processing circuit 7 in the shortest period of time.

As described above, according to this exemplary embodiment, it is possible to estimate the flight time with the data strobe signal. At this time, the circuit size can be reduced as compared with the technique of Japanese Unexamined Patent Application Publication No. 2005-276396. The technique writes data to the DDR SDRAM 9, reads the written data, and then determines whether the value of the read data is correct or not. After that, the phase relationship with the processing circuit 7 is detected using the determination result, to thereby estimate the flight time. Therefore, the technique requires a circuit for writing data to the DDR SDRAM 9, a circuit for reading data, and a circuit for comparing data with an expectation value, resulting in an increase in circuit size. On the other hand, the circuits of this exemplary embodiment calculate the flight time without using the value of the data signal, which eliminates the need for a circuit for reading data and a circuit for comparing data with expectation value. As a result, the size of the circuits for calculating the flight time can be reduced.

Also, there is no need for an expectation value of data (calibration pattern). That is, there is no need to write data to the DDR SDRAM 9. Therefore, the processing circuit 7 can make the delay adjustment circuit 1 shift to the adjustment mode, and make the control unit 20 calculate the flight time in a period in which no access is made to the DDR SDRAM 9. Accordingly, the circuit of this exemplary embodiment can perform fine adjustment of the timing by causing the adjustment circuit to operate during not only an initial period but a normal operating period. As the result, the circuit of this exemplary embodiment can deal with a variation in the flight time caused due to the environmental changes during operation. In the technique of Japanese Unexamined Patent Application Publication No. 2005-276396, for example, a power supply is turned off to restart in the case of adjusting the flight time during operation. In this exemplary embodiment, it is possible to adjust the flight time during operation to adapt to the environmental changes without turning off the power supply of the device.

The delay adjustment circuit 1 uses the internal clock signal of the processing circuit 7 in the case of calculating the flight time. This enables the delay adjustment circuit 1 to obtain the phase relationship between the internal clock signal and the data strobe signal. Therefore, the delay adjustment circuit 1 can perform control using the phase difference between the internal clock and the data strobe signal so that the internal clock can easily capture the data value obtained from the data signal. That is to say, the delay adjustment circuit 1 controls the amount of delay for the data value of the variable delay circuit 16 based on the flight time. This enables the delay adjustment circuit 1 to transfer the data to the internal clock with the smallest amount of delay. On the other hand, if the phase relationship between the internal clock signal and the flight time is unclear, the internal clock signal is treated as an asynchronous clock signal, so a FIFO is necessary. The FIFO synchronizes a signal having an unknown phase relationship to the internal clock signal. Therefore, an extra amount of delay may occur, or the circuit size may be increased. The circuit of this exemplary embodiment requires no FIFO, thereby preventing a delay due to the FIFO and an increase in circuit size.

The delay adjustment circuit 1 generates the valid signal with the flight time. Specifically, because the delay adjustment circuit 1 recognizes the flight time, and thus can control the timing for the valid signal output circuit 22 to output the valid signal after the read command is issued from the processing circuit 7. More specifically, the delay adjustment circuit 1 can control the valid signal output circuit 22 and the mask circuit 13 in accordance with the timing to input the data strobe signal into the buffer 12. Therefore, the data retrieve unit 10 can reliably retrieve the data strobe signal.

The semiconductor device incorporating the delay adjustment circuit of this exemplary embodiment can perform the operation to make access to the DDR SDRAM without restriction of the flight time of the mounting board. The delay adjustment circuit of this exemplary embodiment enables reduction of the circuit size corresponding to the flight time, compared to related arts, resulting in a reduction in chip size of the semiconductor device. Accordingly, it is possible to reduce the cost.

Moreover, the circuit of this exemplary embodiment pulls up the data strobe signal to reliably detect the preamble period. This eliminates the need to set the voltage of the second Vref for distinguishing the high impedance state from the low level, unlike Japanese Unexamined Patent Application Publication No. 2003-223786, for example. As a result, circuits required for these processing can be eliminated in this exemplary embodiment.

[Other Exemplary Embodiments]

While the above exemplary embodiments are described with the use of the DDR SDRAM as an example of a memory, the memory is not limited to the DDR SDRAM. The present invention may also be applied to any memory which outputs the data signal and the data strobe signal in response to the issuance of a read command, like the DDR SDRAM.

The above exemplary embodiments show an example of one semiconductor device (one chip) on which both the delay adjustment device (delay adjustment circuit) and the processing circuit 7 are mounted. The configuration of the semiconductor device is not limited thereto. What kind of functions (circuit) are mounted on one semiconductor device is a design issue, so this invention is a not limited to the above exemplary embodiments.

Although the above exemplary embodiments are described with the use of circuits as the delay adjustment device, means to implement the delay adjustment device are not limited to circuits (hardware). It may be implemented by hardware, firmware, software, or combination thereof, for example. A part of functions may also be implemented by programs, for example. Programs which are stored in a storage area may be loaded into a memory (RAM: Random Access Memory) to be executed by a CPU (Central Processing Unit).

The above exemplary embodiments describe the case where the delay adjustment circuit 1 receives the clock signal used by the processing circuit 7 and uses the received clock signal. In the case of using a clock signal which is different from the clock signal used by the processing circuit 7, it is preferable to include a function to adjust a delay time in the variable delay circuit 16 in order to output a data value in accordance with the clock signal used by the processing circuit 7. It is preferable to implement a function that is realized in a smaller circuit size than in the case of using a FIFO. It is also preferable to implement a function to shorten a period of outputting a data value to the processing circuit 7 as compared to the case of using a FIFO.

Although the above exemplary embodiments are described an example where the adjustment circuit 21 detects the preamble period to calculate the flight time, the adjustment circuit 21 may calculate the flight time using the data transfer period. The number of toggles during the data transfer period is preliminarily defined. The adjustment circuit 21 may also calculate the flight time using a change in waveform of the data strobe signal detected using the number of the toggles.

Although the above exemplary embodiments are described a configuration example in which the processing circuit 7 includes the flip-flop 71, the data retrieve unit 10 may include a flip-flop having a similar function. In this case, the data retrieve unit 10 outputs the data value synchronized with the internal clock signal to the processing circuit 7.

Each of the above-described embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A delay adjustment device that is connected to a memory, and adjusts a timing to retrieve data with a data signal and a data strobe signal output from the memory, the delay adjustment device comprising:
  a data retrieve unit that receives the data signal and the data strobe signal, and outputs a data value of the data signal in accordance with the data strobe signal; and
  a control unit that issues a read command to the memory, retrieves values of the data strobe signal in response to the read command to calculate flight time, and controls a valid period of the data strobe signal based on the flight time,
  wherein the control unit comprises:
    a valid signal output unit that outputs a valid signal to indicate the valid period of the data strobe signal;
    a strobe value retrieve unit that retrieves the values of the data strobe signal in accordance with the valid signal; and
    an adjustment unit that issues the read command, instructs a timing to output the valid signal to the valid signal output unit, retrieves the values of the data strobe signal from the strobe retrieve unit, and calculates the flight time using the retrieved value,
  wherein the adjustment unit instructs the valid signal output unit of the timing to output the valid signal, according to an internal clock signal, and calculates the flight time using a phase difference between the internal clock signal and the data strobe signal,
  wherein the adjustment unit uses a requestor clock signal used by requestor as the internal clock signal, and
  wherein the data retrieve unit comprises:
    a mask unit that enables the data strobe signal in accordance with the valid signal, and outputs the enabled signal;
    a data value retrieve unit that retrieves a data value from the data signal with the signal output from the mask unit; and
    a delay unit that delays the retrieved data value according to the requestor clock signal.

2. The delay adjustment device according to claim 1, wherein the adjustment unit causes the valid signal output unit to output the valid signal at different timings after issuing the read command to retrieve the values of the data strobe signal from the strobe value retrieve unit, and compares a given waveform of the data strobe signal with a change in the values of the data strobe signal to calculate the flight time.

3. The delay adjustment device according to claim 1, wherein:
  the control unit includes a normal mode for issuing the read command by the requestor and an adjustment mode for issuing the read command by itself to calculate the flight time,
  in the normal mode, the adjustment unit notifies the valid signal output unit of a delay time generated until the valid signal is output after the read command is issued from the requestor, based on the calculated flight time,
  the valid signal output unit outputs the valid signal after the delay time from issuance of the read command, and the mask unit enables the data strobe signal with the valid signal.

4. The delay adjustment device according to claim 3, wherein:
  the data strobe signal includes a data transfer period for transferring data by the data signal and a preamble prior to the data transfer period,
  in the adjustment mode, the adjustment unit notifies the valid signal output unit of a time necessary for retrieving the data strobe signal, as the delay time, in response of the read command issued by itself, repeats the issuance of the read command and the notification of the delay time to retrieve the value of the data strobe signal at a plurality of timings, and detects a preamble period of the data strobe signal to calculate the flight time.

5. The delay adjustment device according to claim 4, wherein the adjustment unit causes the data strobe signal to reach a level higher than a high impedance state by pulling up the data strobe signal when issuing the read command.

6. The delay adjustment device according to claim 1, wherein the memory comprises a DDR SDRAM (Double Data Rate Synchronous Dynamic Random Access Memory).

* * * * *